(12) United States Patent
Melanson

(10) Patent No.: US 7,212,137 B2
(45) Date of Patent: May 1, 2007

(54) DELTA SIGMA MODULATOR WITH INTEGRAL DECIMATION

(75) Inventor: John L. Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 92 days.

(21) Appl. No.: 10/682,552

(22) Filed: Oct. 9, 2003

(65) Prior Publication Data

US 2005/0080494 A1 Apr. 14, 2005

(51) Int. Cl.
*H03M 7/32* (2006.01)

(52) U.S. Cl. .................. 341/77; 341/143; 341/155

(58) Field of Classification Search .............. 341/143, 341/155, 60, 141, 77
See application file for complete search history.

(56) References Cited

U.S. PATENT DOCUMENTS

| | | | | |
|---|---|---|---|---|
| 5,055,843 A | | 10/1991 | Ferguson et al. | 341/143 |
| 5,103,228 A | | 4/1992 | Voorman et al. | 341/143 |
| 5,142,286 A | * | 8/1992 | Ribner et al. | 341/143 |
| 5,243,345 A | | 9/1993 | Naus et al. | 341/143 |
| 5,248,972 A | | 9/1993 | Karema et al. | 341/143 |
| 5,471,209 A | * | 11/1995 | Sutterlin et al. | 341/143 |
| 5,627,536 A | * | 5/1997 | Ramirez | 341/141 |
| 5,742,246 A | | 4/1998 | Kuo et al. | 341/143 |
| 5,815,102 A | | 9/1998 | Melanson | 341/143 |
| 5,859,602 A | * | 1/1999 | Tanaka et al. | 341/60 |
| 5,982,317 A | * | 11/1999 | Steensgaard-Madsen | 341/143 |
| 6,064,326 A | | 5/2000 | Krone et al. | 341/143 |
| 6,150,969 A | | 11/2000 | Melanson | 341/143 |
| 6,154,161 A | * | 11/2000 | Leme et al. | 341/143 |
| 6,198,417 B1 | * | 3/2001 | Paul | 341/143 |
| 6,252,531 B1 | * | 6/2001 | Gordon et al. | 341/143 |
| 6,271,782 B1 | * | 8/2001 | Steensgaard-Madsen | 341/143 |
| 6,331,833 B1 | | 12/2001 | Naviasky et al. | 341/143 |
| 6,346,898 B1 | * | 2/2002 | Melanson | 341/143 |
| 6,424,279 B1 | * | 7/2002 | Kim et al. | 341/143 |
| 6,429,797 B1 | * | 8/2002 | Wu | 341/143 |
| 6,433,726 B1 | * | 8/2002 | Fan | 341/155 |
| 6,922,161 B2 | * | 7/2005 | Lee | 341/143 |
| 2003/0163270 A1 | | 8/2003 | Optiz et al. | 702/86 |

OTHER PUBLICATIONS

Fujimori, Ichiro, et al., "A 5v Single-Chip Delta-Sigma Audio A/D Converter with 111dB Dynamic-Range," pp. 329-336, Mar. 1997.
Moussavi, S. Mohsen, et al., "High-Order Single-Stage Single-Bit Oversampling A/D Converter Stabilized with Local Feedback Loops," IEEE Transactions on Circuits and Systems-II: Analog and Digital Signal Processing, vol. 41, No. 1, Jan. 1994, pp. 19-25.

* cited by examiner

Primary Examiner—Jean Bruner Jeanglaude
(74) Attorney, Agent, or Firm—Hamilton & Terrile, LLP; Kent B. Chambers

(57) ABSTRACT

A digital signal processing system utilizes an internal filter of a delta-sigma modulator in a novel manner to implement both the integration functions of the delta-sigma modulator and a decimation function. Using the internal filter to combine integration and decimation functions can eliminate the need for a separate decimation filter. The combination of integration and decimation functions can also improve signal-to-noise ratio by improving low-pass filtering performance.

20 Claims, 10 Drawing Sheets

DELTA SIGMA MODULATOR WITH INTEGRAL DECIMATION

BACKGROUND OF THE INVENTION

1. Field of the Invention

The present invention relates in general to the field of signal processing, and more specifically to a system and method for using an internal filter of a delta-sigma modulator to provide integration and decimation functions.

2. Description of the Related Art

Many signal processing systems, such as audio signal processing systems, utilize delta-sigma modulators to provide output data with a high, in-band signal to noise ratio ("SNR"). FIG. 1 depicts a conventional digital signal processing ("DSP") system 100 for processing a signal source 102 into a digital signal. For example, the DSP system 100 can be used to perform high quality encoding of super audio compact disk ("SACD") data. Analog-to-digital converter ("ADC") 104 receives an input signal from the signal source 102 and converts the signal into a digital signal represented by discrete digital data sampled at a particular sampling frequency, $f_s$. It is well known that operating at large multiples of the sampling frequency spreads typical noise signals across a larger frequency band, thus improving SNR. This is particularly true for audio signals because audio signals reside in a relatively small baseband between 0 Hz and 25 kHz. Currently, a typical ADC 104 operates at 128 times ("*") $f_s$, and operational frequencies are expected to increase to 256*$f_s$ and beyond over time.

Referring to FIGS. 1 and 2, some DSP systems utilize one-bit output data and others utilize multi-bit output data. For example, SACD uses one-bit output data to encode high fidelity audio signals. The ADC 104 typically provides a multi-bit output. DSP system 100 utilizes delta-sigma modulator 108 to provide a high, in-band SNR and to provide a one-bit output when desired. The delta-sigma modulator 108 operates at a lower frequency than ADC 104, such as 64*$f_s$. Additionally, as depicted in FIG. 2, much of the noise energy 202 in the output data of ADC 104 resides near the Nyquist frequency. Thus, decimation filter 106 down samples the output data from ADC 104 and provides a low-pass filter with a frequency response. Without low-pass filtering of the output data from ADC 104, significant noise energy near the pre-decimation Nyquist frequency would fold down into the signal baseband.

Delta-sigma modulator 108 includes an L-order loop filter 110 that includes a series of integration stages to shape the noise in the decimated output data out of the baseband. Delta-sigma modulator 108 also includes a 1 or multi-bit quantizer 112 to provide a series of output bits representative of the baseband input signal by quantizing the output data of loop filter 110 and providing feedback to loop filter 110 in a well-known manner. "Delta-sigma modulators" are also commonly referred to using other interchangeable terms such as "sigma-delta modulators", "delta-sigma converters", "sigma delta converters", and "noise shapers".

FIG. 3 depicts a simulated response of DSP system 100 in the frequency domain when decimating from 128*$f_s$ to 64*$f_s$ for 128*$f_s$ equal to approximately 6 MHz. The z-domain transfer function, H(z), of decimation filter 106 is $H(z)=(1+z^{-1})/2$, which represents a two sample averaging filter. Other transfer functions can be used. The peak quantization noise 302 near the Nyquist frequency of 3 MHz dropped to approximately −40 dB. FIG. 4 depicts an amplified view of the peak quantization noise 302 in the top 20 kHz, which is the energy that would be folded back due to aliasing.

Several problems exist with DSP system 100. For example, use of the decimation filter 106 requires additional processing resources that could be used for other operations and/or occupy additional integrated chip area. Additional noise reduction of noise that will fold into the baseband is advantageous.

SUMMARY OF THE INVENTION

In one embodiment of the present invention, digital signal processing system includes a delta-sigma modulator having an internal filter to integrate and decimate input data and further having a quantizer to provide feedback data to the combination decimation and integration filter.

In another embodiment of the present invention, a method of modulating input data includes integrating and decimating the input data using an internal filter of a delta-sigma modulator to generate output data. The method further includes quantizing the output data using a quantizer of the delta-sigma modulator and providing feedback data from the quantizer to the internal filter of the delta-sigma modulator.

In another embodiment of the present invention, a method of modulating input data sampled at M times a frequency $f_s$ ($Mf_s$) using a delta-sigma modulator operating at frequency $f_s$ includes receiving the input data sampled at frequency $Mf_s$. The method further includes converting the input data into data having a sampled frequency of $f_s$ using an internal filter of the delta-sigma modulator operating at a frequency N times $f_s$ to generate output data and integrating the input data using the internal filter of the delta-sigma modulator. The method also includes quantizing the output data of the internal filter using a quantizer and providing feedback to the internal filter from the quantizer.

In another embodiment of the present invention, a method of using an internal filter of a delta-sigma modulator to decimate and integrate an input signal includes providing first and second data samples and first quantizer feedback data at the same time to a first integration stage, wherein the first and second data samples provided to the first integration stage are respectively modified by a first gain and a second gain. The method also includes providing the first and second data samples and second quantizer feedback at the same time to a second integration stage, wherein the second integration stage receives output data from the first integration stage and the first and second data samples provided to the second integration stage are respectively modified by a third gain and a forth gain and integrating output data from the second integration stage using N-subsequent integration stages to generate quantizer input data, wherein N is any non-negative integer. The method further includes quantizing the quantizer input data, wherein the first and second gains are an independent linear combination with respect to the third and fourth gains.

In another embodiment of the present invention, an apparatus for modulating input data sampled at N times a frequency $f_s$ ($Mf_s$) using a delta-sigma modulator operating at frequency $Nf_s$, wherein M is greater than N, includes means for receiving the input data sampled at frequency $Mf_s$. The apparatus further includes means for integrating and decimating the input data using an internal filter of the delta-sigma modulator operating at a frequency $Nf_s$ to generate output data, means for quantizing the output data of the internal filter using a quantizer, and means for providing feedback to the internal filter from the quantizer.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Increasing resource efficiencies and obtaining better performance represent on-going objectives for digital signal processing systems. A digital signal processing system described herein utilizes an internal filter of a delta-sigma modulator in a novel manner to implement both the integration functions of the delta-sigma modulator and a decimation function. Using the internal filter to combine integration and decimation functions can eliminate the need for a separate decimation filter. The combination of integration and decimation functions can also improve signal-to-noise ratio by improving low-pass filtering performance.

Figure 5:
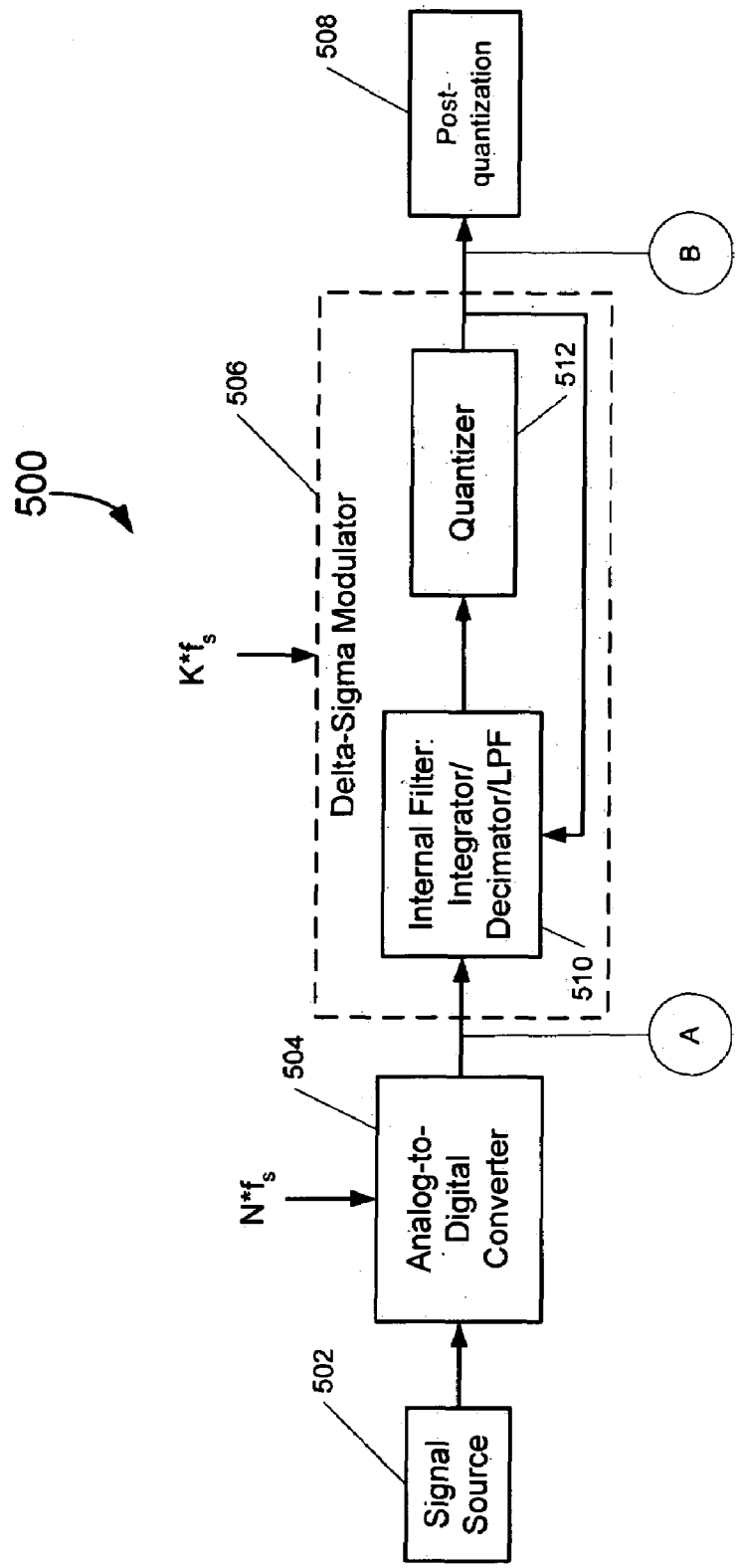
FIG. 5 depicts a digital signal processing system utilizing an internal filter of a delta-sigma modulator to implement both the integration function of the delta-sigma modulator and a decimation function.

Referring to FIG. 5, the signal source 502 of DSP system 500 provides an input signal to ADC 504. Signal source 502 and ADC 504 can be the same as signal source 102 and ADC 104. ADC operates at a frequency N times the sampling frequency of the input signal. In one embodiment, N equals 128, and $128*f_s$ equals approximately 6 MHz. The delta-sigma modulator 506 operates at a frequency of $K*f_s$. In one embodiment delta-sigma modulator 506 operates at a frequency one-half of the ADC 504's operating frequency. The delta-sigma modulator 506 provides output data to post-quantization component(s) 508. In one embodiment, post-quantization component(s) 508 represent an audio recording system, such as an SACD system, for recording high quality audio signals onto a media using the output data generated by the delta-sigma modulator 506. The delta-sigma modulator 506 includes an internal filter 510 that performs both integration functions and decimation/low-pass filtering functions. Quantizer 512 quantizes the output data from internal filter 510 and provides quantized output data to post quantization component(s) 508. Quantizer 512 provides the quantized output data as feedback to internal filter 510.

Figure 6:
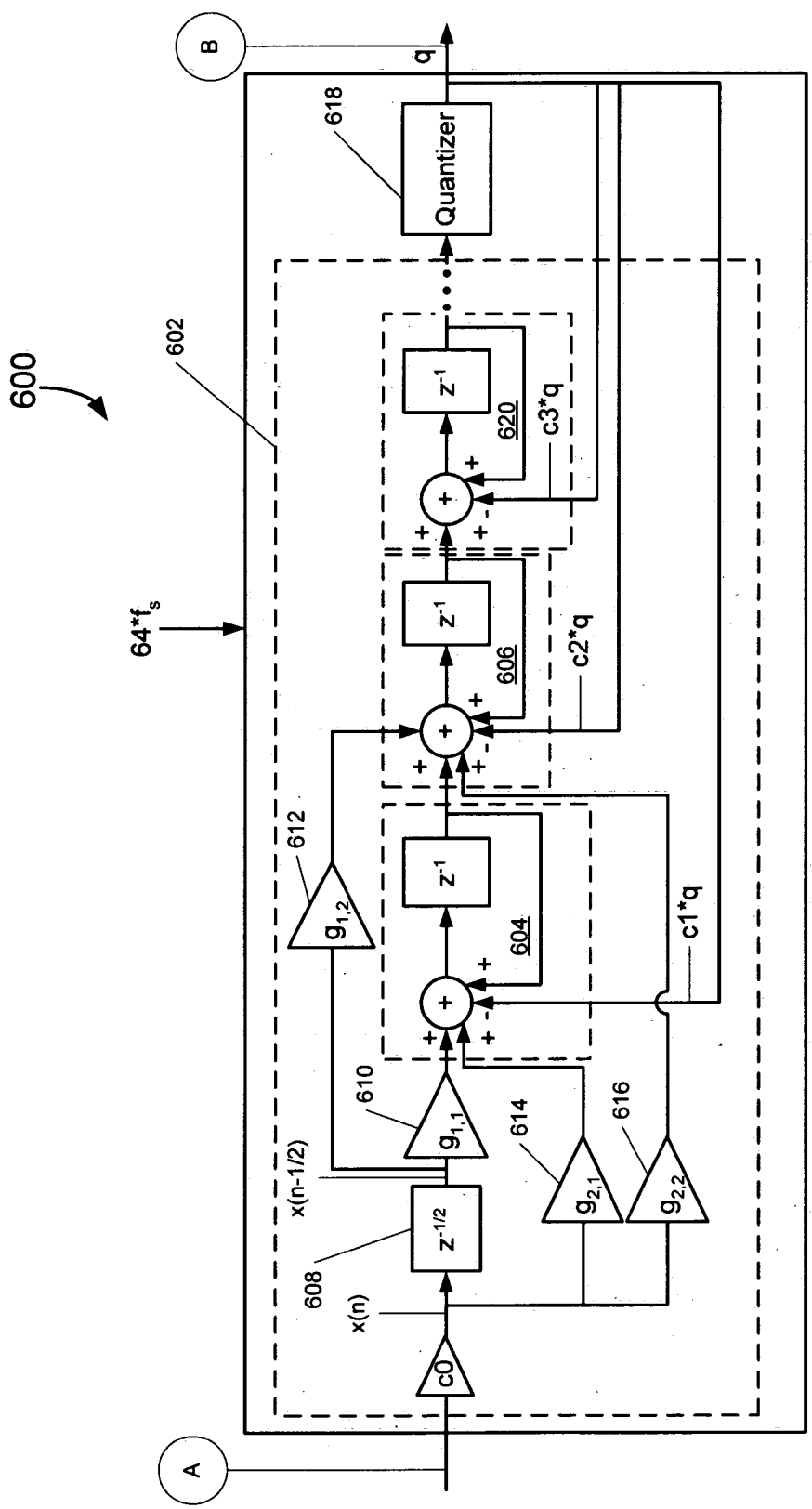
FIG. 6 depicts one embodiment of the delta-sigma modulator of FIG. 5.

FIG. 6 depicts one embodiment of delta-sigma modulator 506 that includes an internal filter 602 used for integration and decimation of an input signal. Points "A" and points "B" represent the same data points as in FIG. 5. The input data to delta-sigma modulator 600 is a discrete input signal sampled at $128*f_s$. Although the input signal is sampled at $128*f_s$, delta-sigma modulator 600 operates at $64*f_s$, one-half the frequency of the input signal. Thus, the input and output of delta-sigma modulator 600 effectively operate at two different frequencies.

The internal filter 602 performs integration and 2-to-1 decimation by using the first two integration stages 604 and 606 to process successive pairs of input data samples, $x(n)$ and $x(n-½)$ and using a half-delay stage 608 with a z-domain transfer function of $z^{-1/2}$. Additional integration stages, such as integration stage 620 can be added as desired to alter the frequency response of delta-sigma modulator 600. The internal filter 602 achieves a high quality low-pass-filter frequency response by adjusting the gain of samples $x(n)$ and $x(n-½)$. Integration stages 604 and 606 can be implemented with a z-domain frequency response of $z^{-1}$, a feedback loop, and an input data summing operation. The input data to integration stage 604 is:

$$x(n-½)*g_{1,1}+x(n)g_{2,1}-c1*q.$$

The input data to integration stage 606 is:

$$I_1+x(n-½)*g_{1,2}+x(n)g_{2,2}+c1*q.$$

"$g_{1,1}$", "$g_{1,2}$", "$g_{2,1}$", and "$g_{2,2}$" represent respective gain stages 610, 612, 614, and 616. "$I_1$" represents the output data of integration stage 604. The output data of quantizer 618 provides negative feedback to each integration stage of delta-sigma modulator 600 adjusted by respective factors c1, c2, c3, and so on. In one embodiment, c0 is 0.5, and the remaining "c" factors are a matter of design choice. "Delta-Sigma Data Converters Theory, Design, and Simulation" by Norsworthy, et al., published by IEEE Press, 1997 includes information for determining the c1, c2, c3, and so on.

The gains to the first integration stage 604, i.e. $g_{1,1}$ and $g_{2,1}$ and the gains to the second integration stage 606, i.e. $g_{1,2}$ and $g_{2,2}$, are independent linear combinations. In other words, $$\frac{g_{2,2}}{g_{1,2}} \neq \frac{g_{2,1}}{g_{1,1}}.$$

Thus, integration stages 604 and 606 receive a different mix of input signal pairs $x(n)$ and $x(n-½)$.

Figure 7:
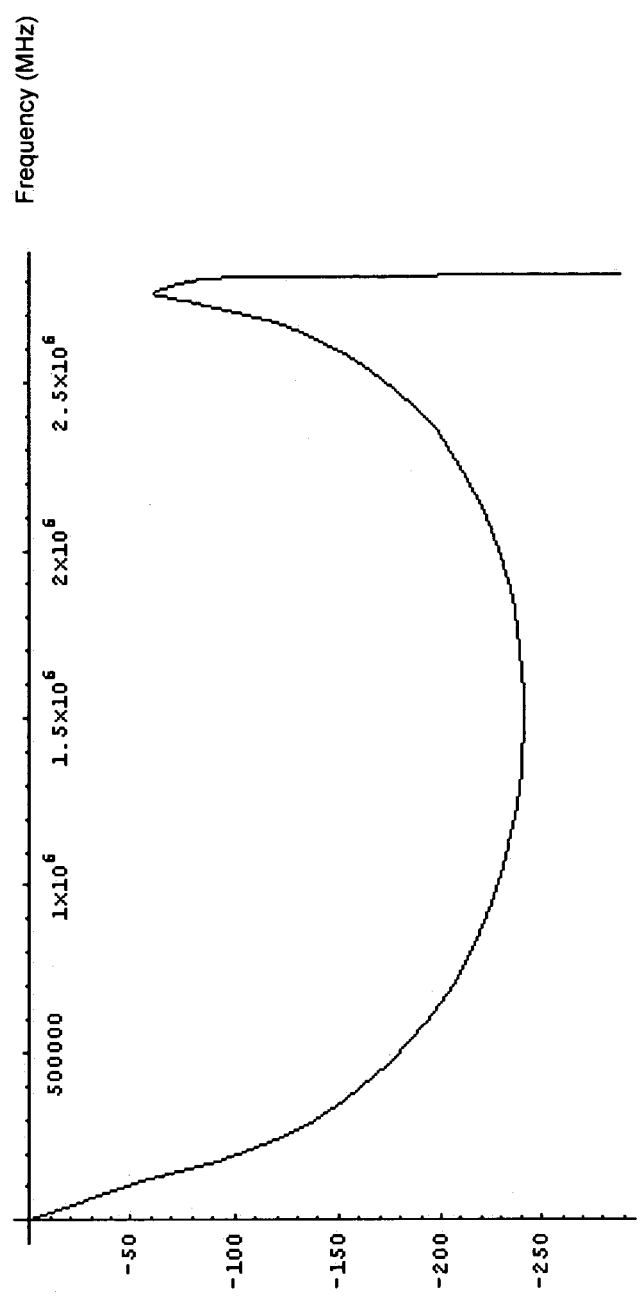
FIG. 7 depicts a first frequency response of the delta-sigma modulator.
Figure 8:
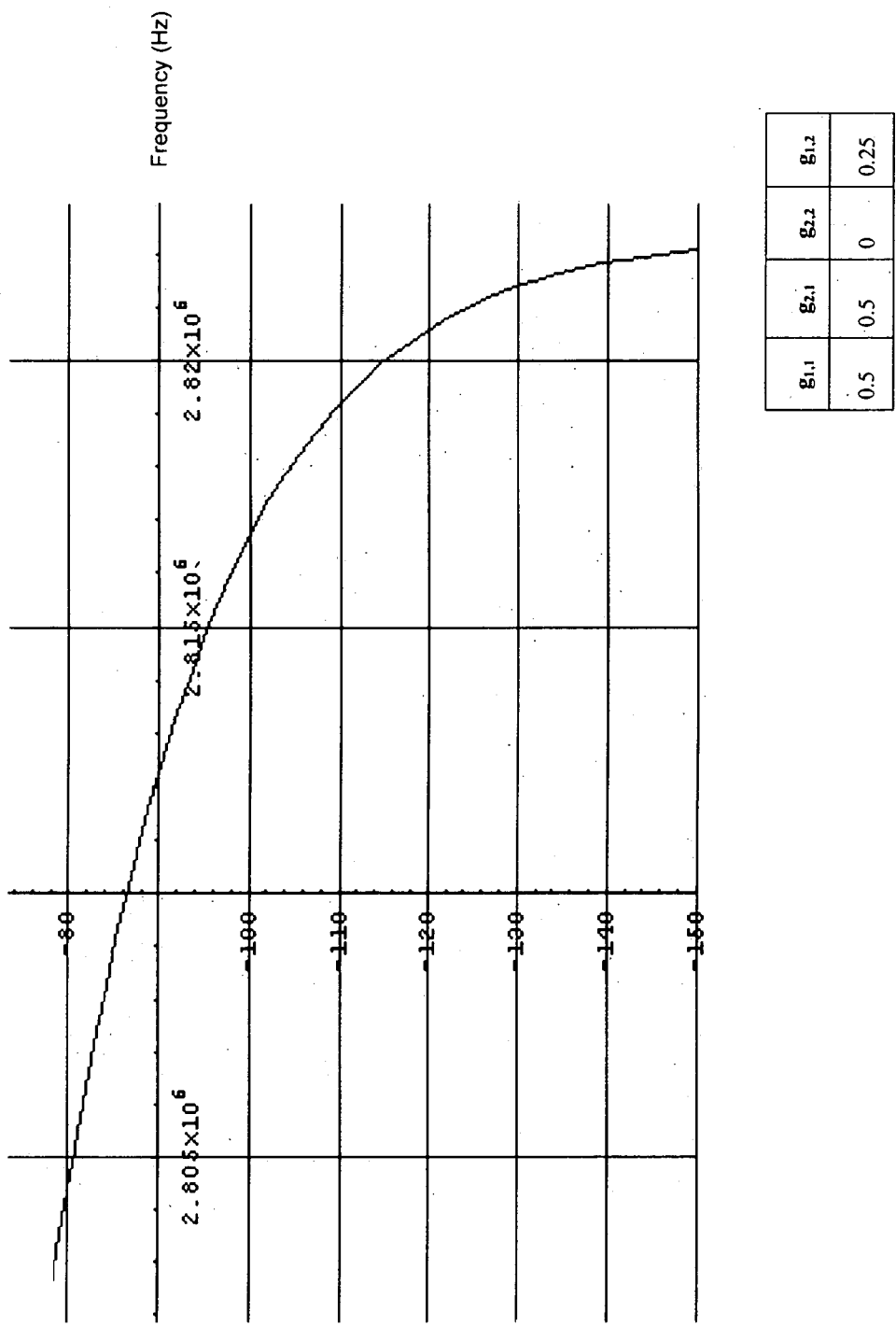
FIG. 8 depicts an amplified view of the peak quantization noise depicted in FIG. 7.
Figure 9:
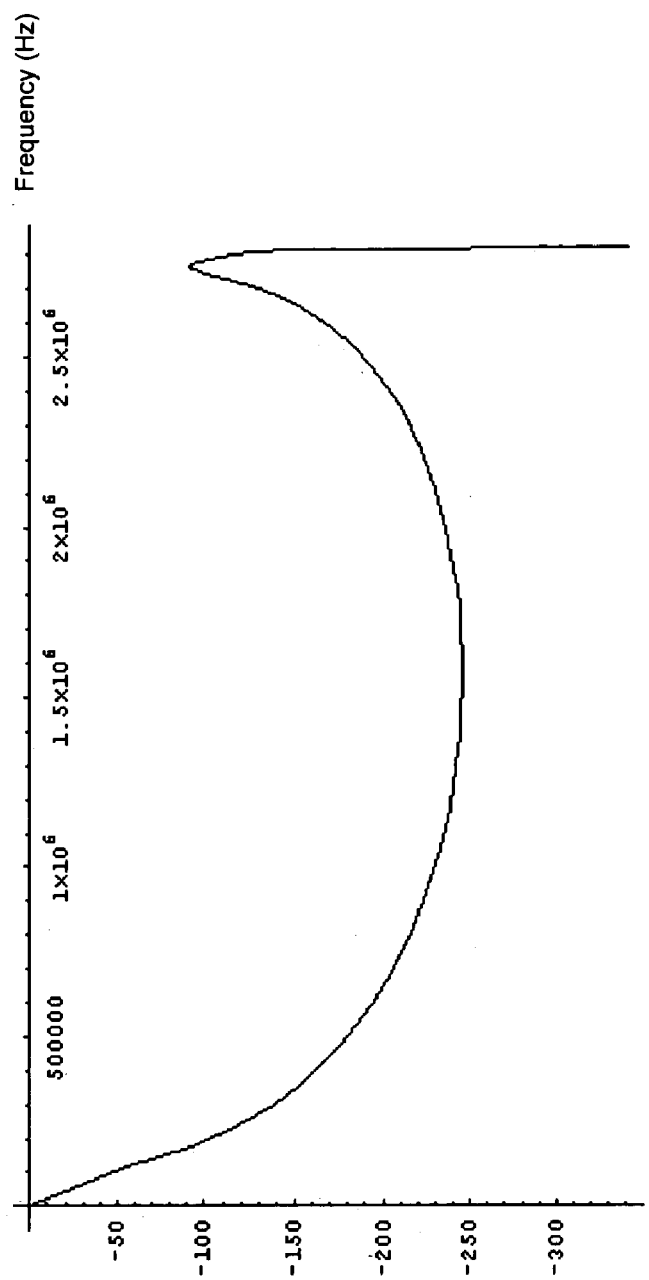
FIG. 9 depicts a second frequency response of the delta-sigma modulator.
Figure 10:
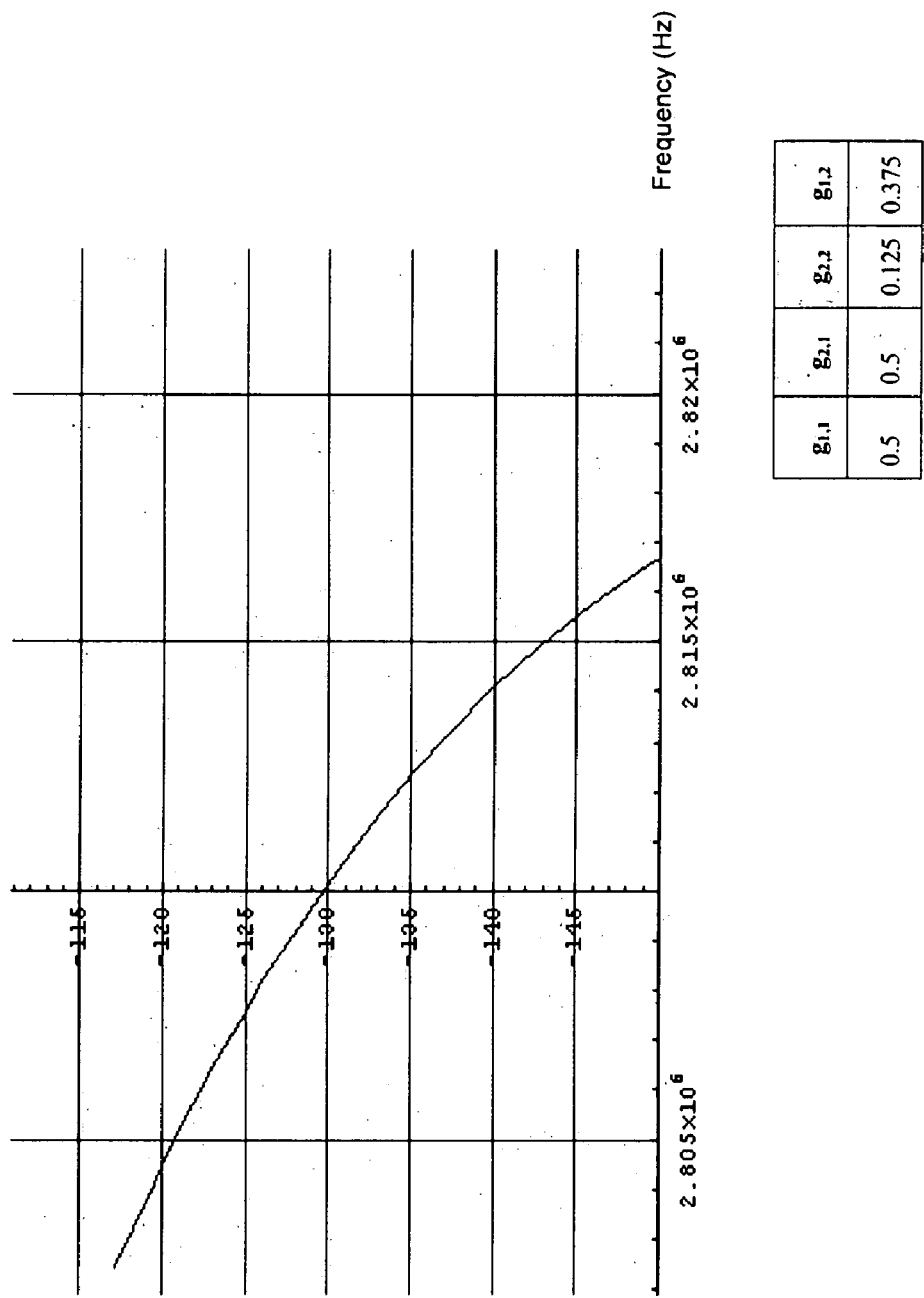
FIG. 10 depicts an amplified view of the peak quantization noise depicted in FIG. 9.

FIGS. 7, 8, 9, and 10 depict a frequency response of the delta-sigma modulator 600 using the same input data used with the conventional DSP system 100. FIG. 8 specifically depicts an amplified view of the peak quantization noise depicted in FIG. 7. FIG. 10 specifically depicts an amplified view of the peak quantization noise depicted in FIG. 9.

Table 1 contains the empirically determined values of gains "g" to achieve the frequency responses depicted in FIGS. 7, 8, 9, and 10.

TABLE 1

| FIGS. | $g_{1,1}$ | $g_{2,1}$ | $g_{2,2}$ | $g_{1,2}$ |
|---|---|---|---|---|
| 7 and 8 | 0.5 | 0.5 | 0 | 0.25 |
| 9 and 10 | 0.5 | 0.5 | 0.125 | 0.375 |

Figure 1:
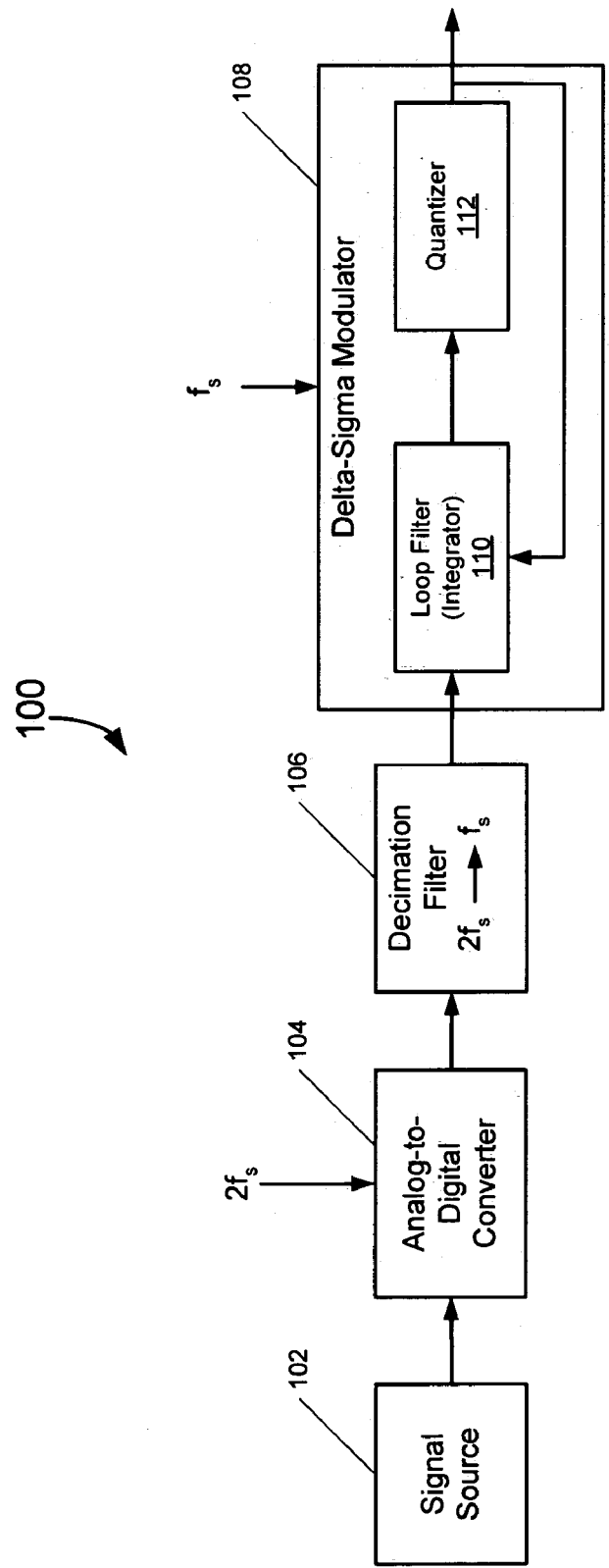
FIG. 1 depicts a conventional digital signal processing according to the prior art.
Figure 2:
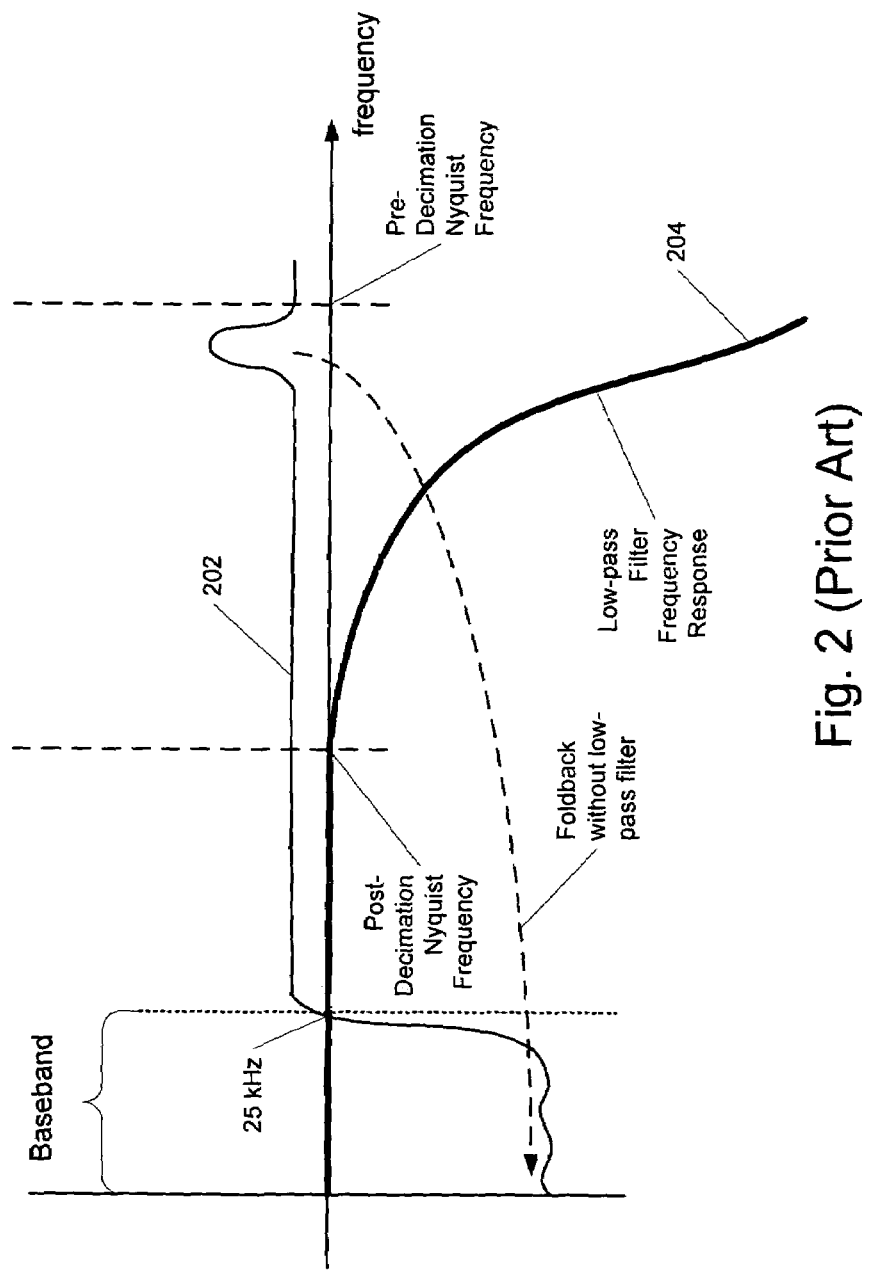
FIG. 2 depicts the frequency response of analog-to-digital converter and low-pass-filter of the digital signal processing system of FIG. 1.
Figure 3:
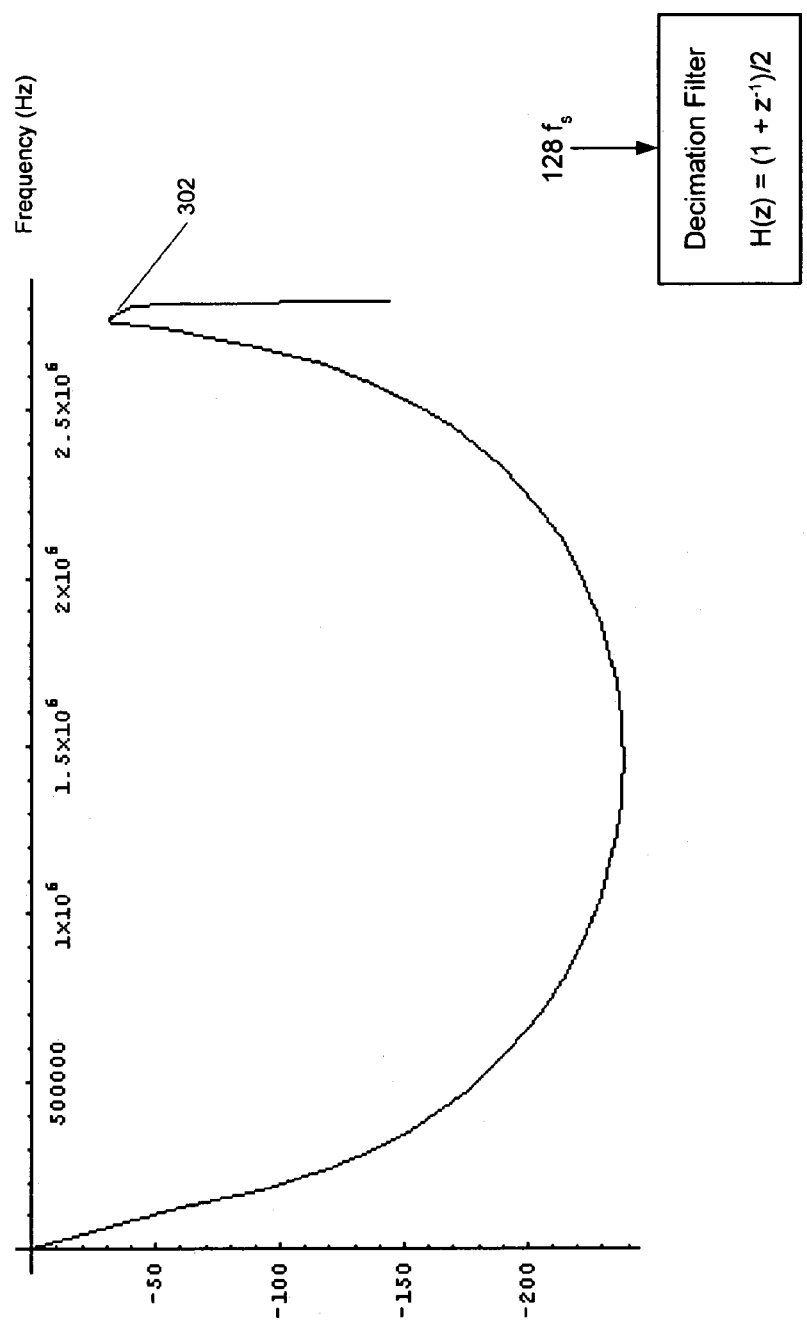
FIG. 3 depicts a simulated frequency response of the digital signal processing system of FIG. 1.
Figure 4:
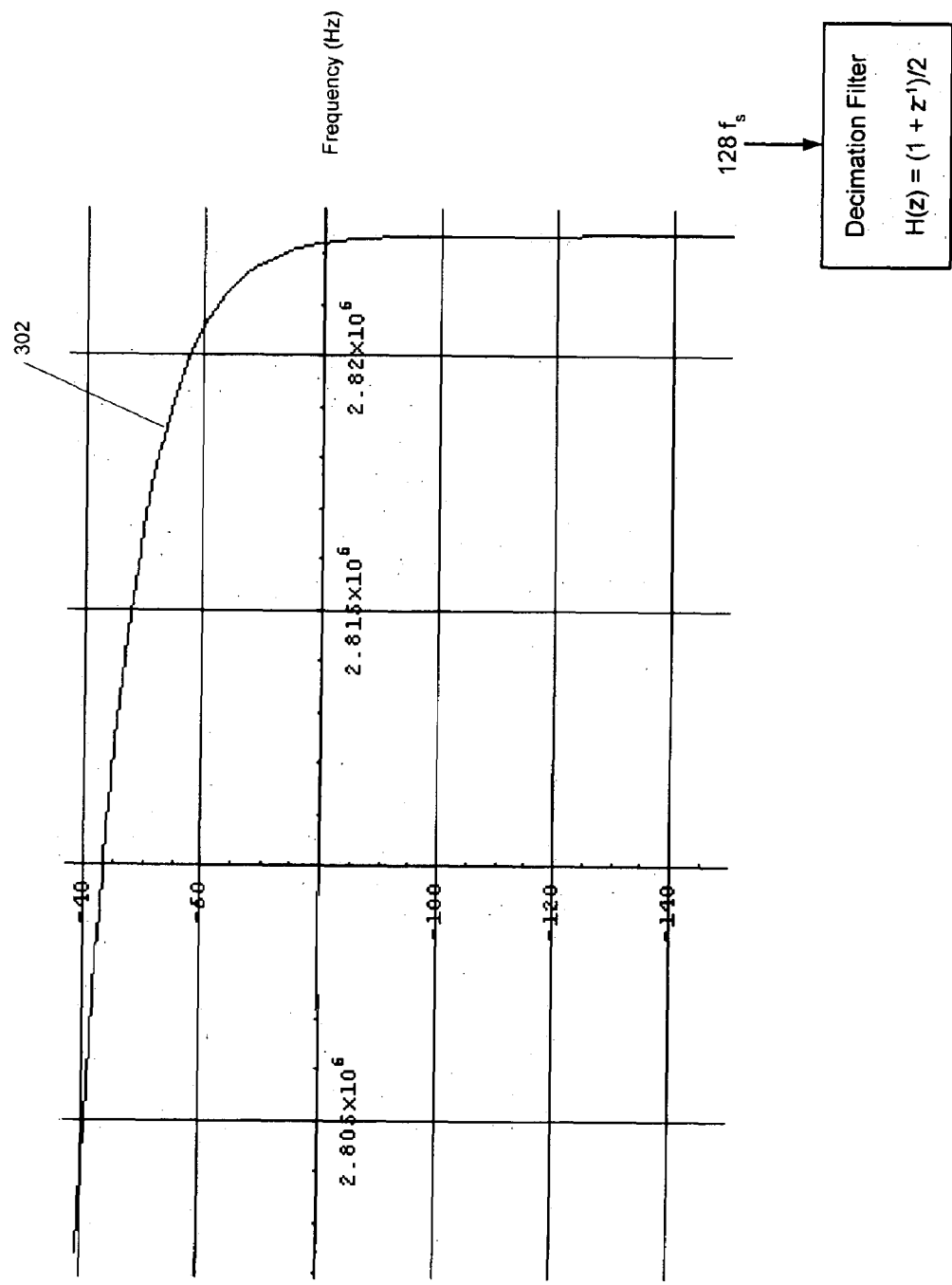
FIG. 4 depicts an amplified view of the peak quantization noise depicted in FIG. 3.

The delta-sigma modulator 600 using the gains "g" Table 1 associated with FIGS. 7 and 8 achieves a frequency response improvement of over 50 dB compared with the conventional frequency response depicted in FIGS. 3 and 4.

The delta-sigma modulator 600 using the gains "g" and factors "c" in Table 1 associated with FIGS. 9 and 10 achieves a frequency response improvement of over 65 dB compared with the conventional frequency response depicted in FIGS. 3 and 4.

The DSP system 200 and the delta-sigma modulator 202 in particular can be implemented using analog and/or digital hardware components. Furthermore, DSP system 200 and the delta-sigma modulator 202 in particular can also be implemented using software and/or firmware.

Thus, the delta-sigma modulator 600 using an internal filter to combine integration and decimation functions can eliminate the need for a separate decimation filter. Furthermore, the delta-sigma modulator 600 enables pre-modulation front-end components to operate at a faster rate and eliminates the need for a separate decimation filter to accommodate a delta-sigma modulator operating at a slower rate.

Although the present invention has been described in detail, it should be understood that various changes, substitutions and alterations can be made hereto without departing from the spirit and scope of the invention as defined by the appended claims.

What is claimed is:

1. A digital signal processing system comprising:
   a delta-sigma modulator having an internal filter coupled to a quantizer, wherein
   (i) the delta sigma modulator implements a low-pass signal transfer function, (ii) an input sample rate of input samples received by the delta sigma modulator is an integer multiple greater than one of an output sample rate of the delta sigma modulator, (iii) the internal filter and the quantizer of the delta sigma modulator operate at the output sample rate $f_s$, and (iv) the internal filter comprises:
      a first integrator to process the input samples and generate a first integrator output signal; and
      a second integrator, coupled to the first integrator, to process first and second input samples and the first integrator output signal during a single cycle of the delta sigma modulator, wherein the first and second input samples represent two successive-in-time samples of an input signal to the delta sigma modulator, the first and second input samples are modified by different gains prior to processing by the second integrator, and the cycle of the delta sigma modulator equals $1/f_s$.

2. The digital signal processing system of claim 1 wherein the input sample rate has a frequency equal to N times $f_s$, wherein N is an integer greater than one.

3. The digital signal processing system of claim 2 wherein N equals 2.

4. The digital signal processing system of claim 1 further comprising:
   an analog-to-digital converter to convert an analog signal into digital data and provide the digital data to the delta-sigma modulator, wherein the output sample rate of the delta-sigma modulator has a frequency of $f_s$, and the input sample rate has a frequency equal to N times $f_s$, wherein N is an integer greater than one.

5. The digital signal processing system of claim 1 wherein the input data includes an audio signal.

6. The digital signal processing system of claim 1 wherein the delta sigma modulator composes:
   a quantizer;
   a first gain stage, coupled to the first integrator, to modify a first input data sample by a first gain and generate a first gain modified input data sample;
   a second gain stage, coupled to the first integrator, to modify a second input data sample by a second gain and generate a second gain modified input data sample;
   a third gain stage, coupled to the second integrator, to modify the first input data sample by a third gain and generate a third gain modified input data sample;
   a fourth gain stage, coupled to the second integrator, to modify the second input data sample by a fourth gain and generate a fourth gain modified input data sample;
   the first integrator comprises:
      components to integrate, during the single cycle of the delta sigma modulator, a sum of the first gain modified and second gain modified input data samples, output data from a delay stage in an internal feedback path from an output of the first integrator, and first negative feedback data from the quantizer; and
   the second integrator comprises:
      components to integrate, during the single cycle of the delta sigma modulator, the third gain modified and the fourth gain modified input data samples, output data from a delay stage in an internal feedback path from an output of the second integrator, and second negative feedback data from the quantizer;
   wherein the first and second gains are an independent linear combination with respect to the third and fourth gains.

7. A method of modulating input data comprises:
   receiving the input data with a delta-sigma modulator, wherein an input sample rate of the input data to the delta sigma modulator is N times f, wherein N is an integer greater than one and f is a frequency; and
   processing the received input data using an internal filter and a quantizer of the delta sigma modulator, wherein the internal filter and the quantizer operate at the frequency f, wherein processing the received input data comprises: low pass filtering the input data using the internal filter, wherein low pass filtering the input data comprises:
      during one delta sigma modulator cycle equal to 1/f, updating a first integrator with at least one sample of the received input data;
      generating a first integrator output signal;
      modifying a first input data sample with a first gain to generate a first gain modified input data sample;
      modifying a second input data sample with a second gain to generate a second modified input data sample, wherein the first gain is different than the second gain and the first and second input samples are successive-in-time data samples of the received input data; and
      during one delta sigma modulator cycle equal to 1/f, updating a second integrator with (i) the first gain modified input data sample, (ii) the second gain modified input data sample, and (iii) the first integrator output signal;
   quantizing the input data filtered by the internal filter using the quantizer; and
   providing output data quantized by the quantizer at an output sample rate of frequency f.

8. The method of claim 7 wherein low pass filtering the input data further comprises:
   integrating and decimating the input data at the frequency f.

9. The method of claim 7 further comprising:
   converting the input data from an analog signal into a digital signal at a frequency of N times f immediately prior to low pass filtering the input data.

10. The method of claim 9 wherein N equals 2.

11. A method of modulating input data sampled at M times a frequency $f_s$ ($Mf_s$) using a delta-sigma modulator operating at frequency $f_s$, wherein M is greater than one, the method comprising:
  receiving the input data having a sampling frequency $Mf_s$ at an input of the delta sigma modulator;
  converting the input data into low pass filtered data having a sampled frequency of $f_s$ using an internal filter of the delta-sigma modulator operating at the delta sigma modulator operating frequency of $f_s$ to generate output data, wherein converting the input data into low pass filtered data comprises:
    during one delta sigma modulator cycle equal to $1/f_s$, updating a first integrator with at least one sample of the received input data;
    generating a first integrator output signal;
    modifying a first input data sample with a first gain to generate a first gain modified input data sample;
    modifying a second input data sample with a second gain to generate a second gain modified input data sample, wherein the first and second gains are different and the first and second input data samples are successive-in-time data samples of the received input data; and
    during one delta sigma modulator cycle equal to $1/f_s$, updating a second integrator with (i) the first gain modified input data sample, (ii) the second gain modified input data sample, and (iii) the first integrator output signal;
  quantizing the output data of the internal filter using a quantizer operating at the delta sigma modulator operating frequency of $f_s$; and
  providing feedback to the internal filter from the quantizer.

12. The method of claim 11 wherein converting the input data into low pass filtered data using the internal filter of the delta-sigma modulator further comprises:
  modifying the first input data sample with a third gain to generate a third gain modified input data sample;
  modifying the second input data sample with a fourth gain to generate a second modified input data sample, wherein the third and fourth gains are different;
  during the one delta sigma modulator cycle equal to $1/f_s$, updating the first integrator with (i) the third gain modified input data sample, (ii) the fourth gain modified input data sample, and (iv) first quantizer feedback;
  during the one delta sigma modulator cycle equal to $1/f_s$, further updating the second integrator with second quantizer feedback;
  wherein the first and second gains are an independent linear combination with respect to the third and fourth gains.

13. The method of claim 11 further comprising:
  converting the input data from an analog signal into a digital signal at the frequency of $Mf_s$ immediately prior to converting the input data into low pass filtered data at a frequency of $f_s$ using the internal filter of the delta-sigma modulator.

14. The method of claim 11 wherein N is two.

15. The method of claim 11 wherein the input data includes an audio signal.

16. A recording media encoded with data based on the output data generated using the method of claim 11.

17. A method of using an internal filter of a delta-sigma modulator to decimate and integrate an input signal, the method comprising:
  modifying a first data sample of the input signal by a first gain and, independently, by a second gain;
  modifying a second data sample of the input signal by a third gain and, independently, by a fourth gain, wherein the first and second data samples are successive-in-time samples of the input signal;
  during one delta sigma modulator cycle, providing first and second data samples modified by the respective first and third gains and first quantizer feedback data to a first integrator;
  during one delta sigma modulator cycle, providing the first and second data samples modified by the respective second and fourth gains, second quantizer feedback, and output data from the first integrator to a second integrator;
  integrating output data from the second integrator using N-subsequent integration stages to generate quantizer input data, wherein N is any non-negative integer;
  quantizing the quantizer input data; and
  wherein the first and second gains are an independent linear combination with respect to the third and fourth gains.

18. The method of claim 17 wherein providing the first and second data samples further comprises providing the first and second data samples directly from an analog-to-digital converter.

19. The method of claim 17 further comprising:
  using the quantized input data to encode an audio signal on a recording medium.

20. An apparatus for modulating input data sampled at N times a frequency $f_s$ ($Mf_s$) using a delta-sigma modulator operating at frequency $Nf_s$, wherein M is greater than N, the apparatus comprising:
  means for receiving the input data having a sampling frequency $Mf_s$ at an input of the delta sigma modulator;
  means for converting the input data into low pass filtered data having a sampled frequency of $f_s$ using an internal filter of the delta-sigma modulator operating at the delta sigma modulator operating frequency of $f_s$ to generate output data, wherein the means for converting the input data into low pass filtered data comprises:
    means for updating a first integrator with at least one sample of the received input data during one delta sigma modulator cycle equal to $1/f_s$;
    means for generating a first integrator output signal;
    means for modifying a first input data sample with a first gain to generate a first gain modified input data sample;
    means for modifying a second input data sample with a second gain to generate a second gain modified input data sample, wherein the first and second gains are different and the first and second input data samples are successive-in-time data samples of the received input data; and
    means for updating a second integrator with (i) the first gain modified input data sample, (ii) the second gain modified input data sample, and (iii) the first integrator output signal during one delta sigma modulator cycle equal to $1/f_s$;
  means for quantizing the output data of the internal filter using a quantizer operating at the delta sigma modulator operating frequency of $f_s$; and
  means for providing feedback to the internal filter from the quantizer.

* * * * *